United States Patent [19]

Schwartz

[11] 4,257,109
[45] Mar. 17, 1981

[54] BUBBLE NUCLEATOR

[75] Inventor: Sidney J. Schwartz, Vista, Calif.

[73] Assignee: Burroughs Corporation, Detroit, Mich.

[21] Appl. No.: 65,987

[22] Filed: Aug. 13, 1979

[51] Int. Cl.³ .............................................. G11C 19/08
[52] U.S. Cl. ...................................................... 365/11
[58] Field of Search .................................... 365/11, 12

[56] References Cited

U.S. PATENT DOCUMENTS 3,868,661  2/1975  Bonyhard et al. ....................... 365/12

*Primary Examiner*—James W. Moffitt
*Attorney, Agent, or Firm*—Joseph R. Dwyer; Charles J. Fassbender; Kevin R. Peterson

[57] ABSTRACT

A bubble (domain) generator comprising a pair of relatively long elements of suitable magnetic material, such as permalloy, separated by a narrow gap, near which bubbles will be generated in the bubble film by the combined effect of local in-plane and perpendicular magnetic field components to assist in nucleation. In one embodiment, the gap is formed straight by spaced apart edges between the elements and, in another embodiment, the gap is formed to define an apex by V-shaped by complementary tapered spaced apart edges between the elements. Both embodiments may have their gap edges brought close to the bubble film and may have a current carrying hairpin loop conductor substantially surrounding the gap to assist in nucleation.

10 Claims, 6 Drawing Figures

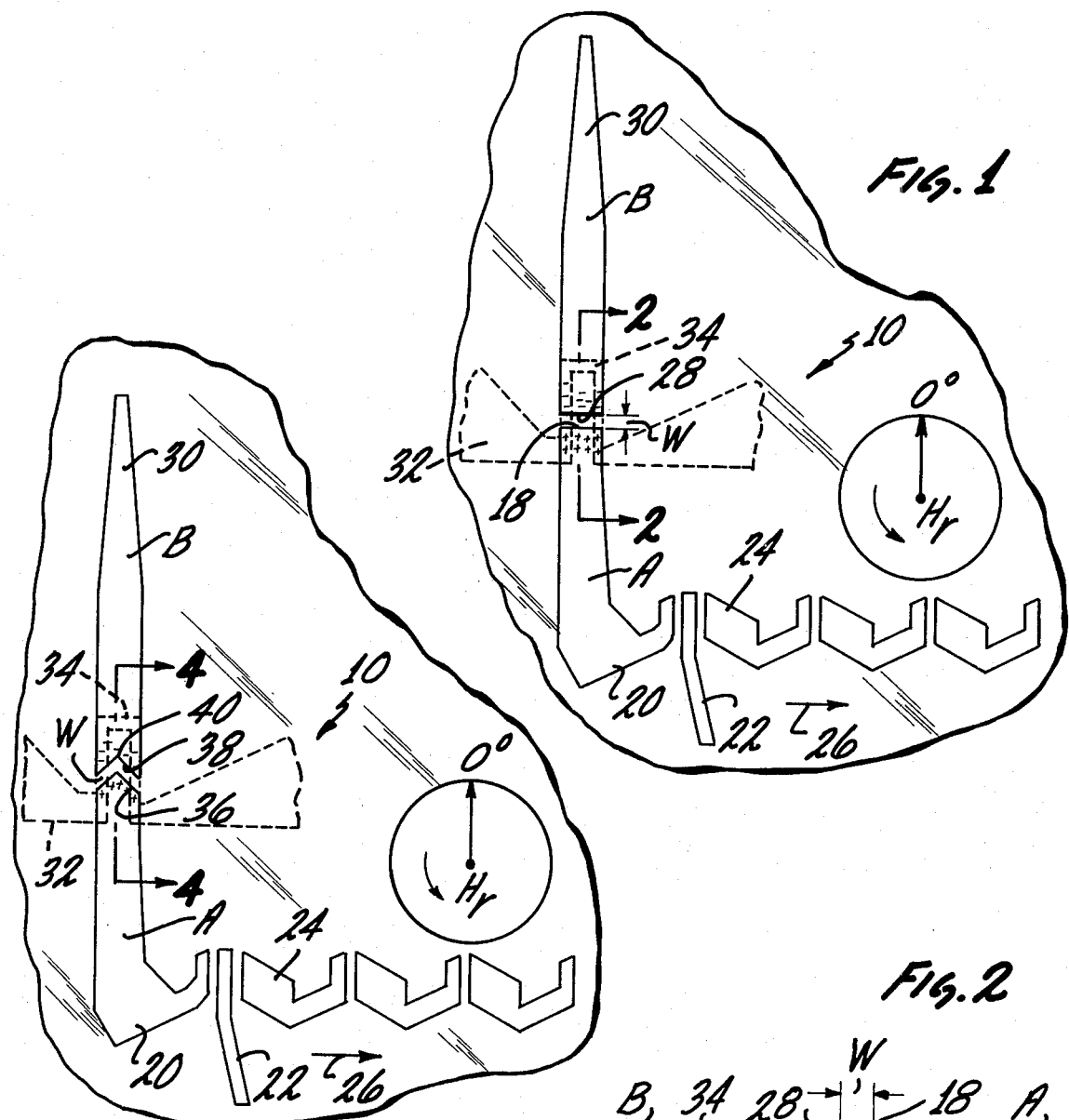
Fig. 1
Fig. 3
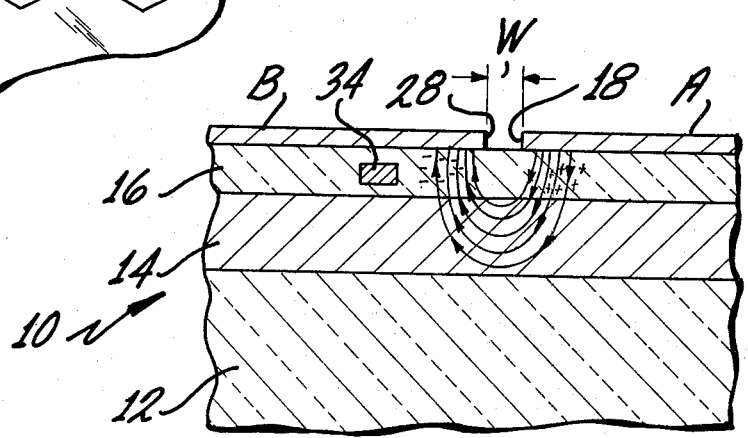
Fig. 2

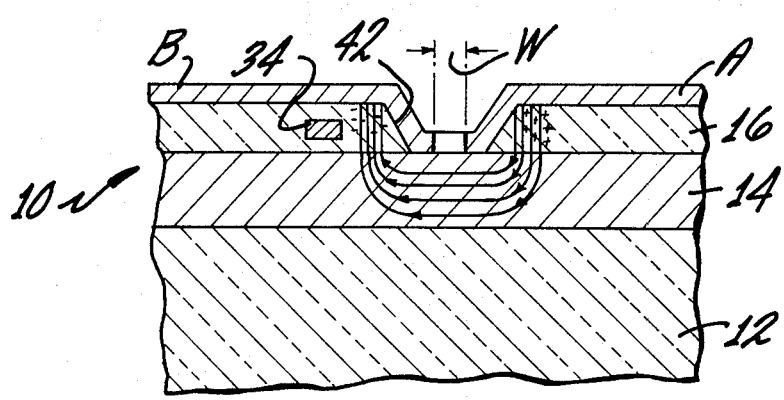
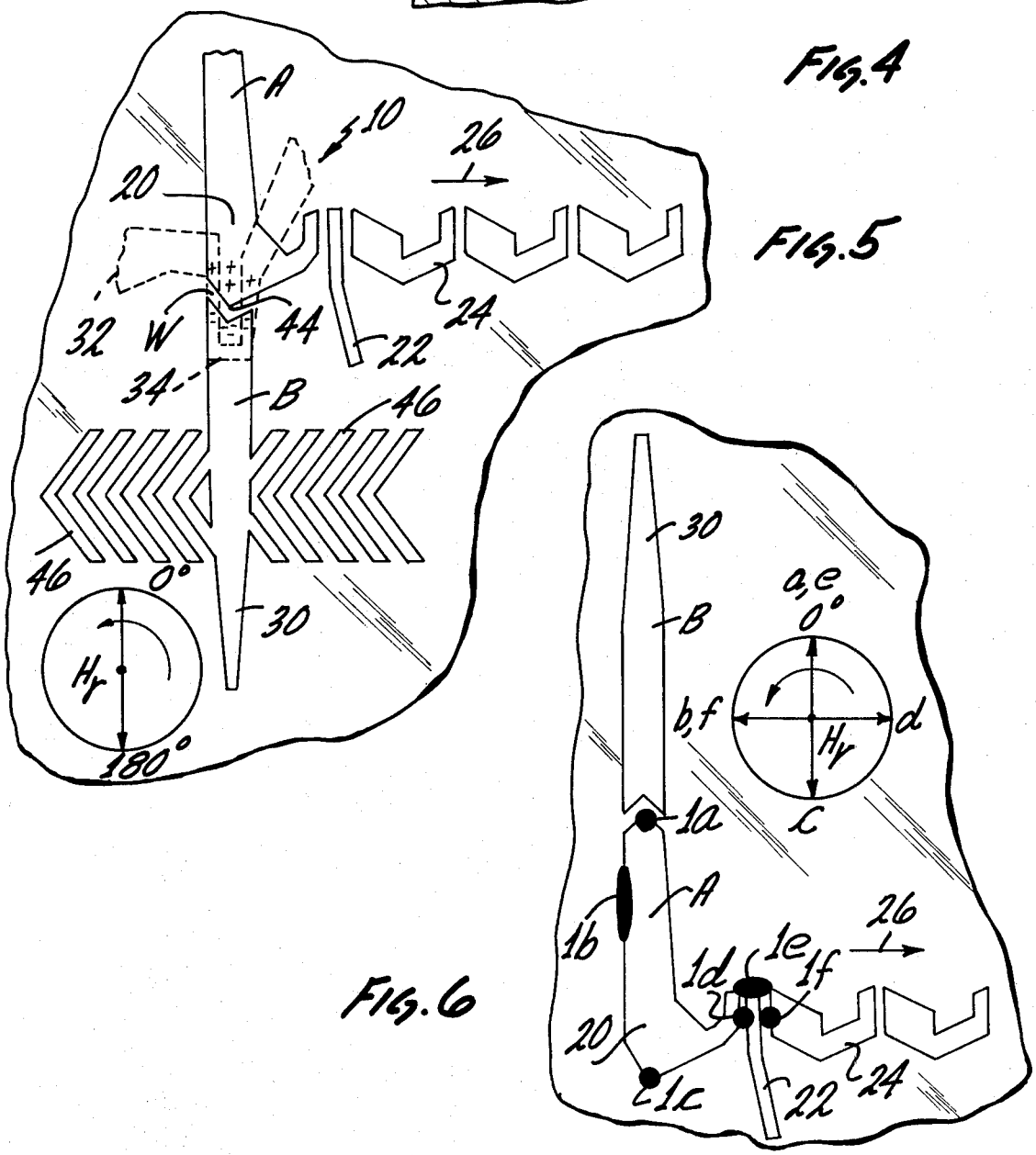

BUBBLE NUCLEATOR

BACKGROUND OF THE INVENTION

This invention relates to bubble (domain) memory devices and in particular to a device for generating bubbles therefor.

The use of bubble generators to generate bubbles for use in memory devices is, of course, old at this time. However, such prior art bubble generators typically operate at high current densities where electromigration failure probabilities are higher than desirable. This invention overcomes the defect in the prior art by utilizing the rotating in-plane magnetic field to provide much more of the energy required for bubble nucleation.

SUMMARY OF THE INVENTION

The bubble (domain) generator of this invention comprises a pair of relatively long elements of suitable magnetic material, such as permalloy, separated by a narrow gap, near which bubbles will be generated in the bubble film by the combined effect of the in-plane and perpendicular magnetic field components. The use of a narrow gap reduces the demagnetizing fields in both of the elongated permalloy elements resulting in concentrated magnetic poles near the gap yielding both large local in-plane and perpendicular fields in the bubble film when the propagation rotating field is directed along the elements thus providing most of the energy for domain nucleation. In one embodiment, the gap is formed straight by spaced apart edges between the elements and, in another embodiment, the gap is formed V-shaped by complementary tapered spaced apart edges between the elements with the apex of the gap pointing in the direction of the major axes of the elements. Both embodiments may have their gap edges brought close to the bubble film and may have a current carrying hairpin loop conductor substantially surrounding the gap which when subjected to a brief current pulse will assist in nucleation.

Accordingly, it is the object of this invention to provide a bubble generator which utilizes the large field generated beneath a narrow gap between elongated permalloy elements to supply the energy required for bubble nucleation and reduce or eliminate current levels in hairpin shaped conductors to alleviate the electromigration problem in present bubble generators.

BRIEF DESCRIPTION OF THE DRAWINGS

FIG. 1 illustrates an enhanced bubble generator according to the invention with a pair of elongated elements separated by a gap near which the bubbles will be generated;

FIG. 2 is a cross-sectional view of a substrate, taken along 2—2 of FIG. 1, and illustrating the generator of FIG. 1 and its relationship to the bubble field and the bubble film at a one direction of the in-plane magnetic field;

FIG. 3 is a second embodiment of the invention with a V-shaped gap between the elements;

FIG. 4 is a cross-sectional view of a substrate, taken along line 4—4 of FIG. 3, and illustrating the elements of the generator engaging the bubble film and with the bubble field again at one direction of the in-plane magnetic field;

FIG. 5 illustrates a third embodiment of the invention with the elements of FIGS 1-4 reversed but still with a V-shaped gap as in FIG. 3; and FIG. 6 taken together with a vector diagram of the in-plane magnetic field $H_r$ to illustrate the operation of the generator through one and a quarter cycles of the in-plane magnetic field.

BRIEF DESCRIPTION OF THE PREFERRED EMBODIMENT

Taking FIGS. 1 and 2 together, there is shown a passive generator 10 comprising a pair of relatively long thin elements A and B of suitable magnetic material, such as permalloy, separated by a gap W on a substrate 12, such as (GGG), a bubble film material 14, such as a garnet, with the elements A and B separated from the bubble film by an insulating material 16, such as silicon dioxide. The substrate material, bubble film and insulating material as well as the material making up the pair of elements A and B is, of course, conventional.

Element A is considered a nucleating element and has a straight edge 18 at its top (as shown in the drawings) and is configured at its lower end as a propagate element 20. The lower end is spaced by a pick-off bar 22 from a first asymmetrical chevron element 24 forming the beginning of a bubble flow path, as indicated by arrow 26.

Element B is considered a field assisting element and has its lower straight edge 28 facing the top straight edge 18 of element A and is of the same length or slightly longer than edge 18 to define the gap W and element B is pointed in a direction opposite from a nucleating element A and terminates in a taper 30 to configure the element substantially knife-like. Beneath generator 10 is a current carrying conductor 32 with a hairpin loop 34 spanning the gap W. This current carrying conductor 32 is connected to a suitable source of current, control circuits and other circuitry, all of which are old and well-known (and thus not shown) for the operation of bubble device in which the present invention is incorporated.

The generator elements A and B are under the influence of a rotating in-plane magnetic field $H_r$ represented by a vector diagram.

When the field direction is at 0°, as represented by the vector arrow, magnetic poles are present on the elements about the gap W. In this field direction, element B will have negative poles, and element A, the nucleating element, will have positive poles as shown in FIGS. 1 and 2; a positive pole being defined as that which provides a local field tending towards nucleation of a bubble and a negative pole one tending towards bubble collapse.

Specifically in FIG. 2, for the rotating field direction of FIG. 1, it can be seen that there is a large in-plane component of the magnetic field in the bubble film layer with large vertical components, both positive and negative, defined by the elements at the gap W. Under the edge of element B, the vertical component is upward, or negative, and under the edge of element A, the vertical component is downward or positive. Thus, element A is the element which would nucleate bubbles at gap W, whereas element B, with the upward component of the magnetic field is considered the bubble killing element.

When the gap W in a magnetic material is narrow and the field applied to the material is directed to cause a magnetic field to cross the gap, the local pole strength is increased near the gap due to the reduction of the demagnetizing field. Thus, the field concentration is increased at the gap as the gap is made narrower. The limit of narrowness of the gap occurs when the depth to which the field projects beneath the gap (the depth reduces as the gap reduces), does not sufficiently penetrate the bubble film in which nucleation is desired. Note, the axes is located in or near the axes of the elements.

Turning now to FIGS. 3 and 4, there is shown a second embodiment of the invention where the top edge 36 of the nucleating element A is tapered and is spaced from a complementary edge 38 on the field assisting element B to define an axes 40 shown as a V-shaped gap with the apex pointing in a direction of the major axes of the elements. This embodiment increases the positive pole concentration at the apex of the gap and enhances nucleation of bubbles in the film. By "narrow" is meant a gap whose width is in the order of one-fourth to two bubble diameters. (Those components having the same functions as similar components in FIGS. 1 and 2 are given the same reference identification). FIG. 4 shows another aspect of the invention in addition to showing a cross-section of a substrate a recess shown as V-shaped groove 42 is formed in the insulating layer 16 (silicon dioxide) so that the portions of the elements A and B defining the V-shaped gap will be formed during the processing of the elements so as to be closer or in contact with the bubble film. This reduces the rotating field required to field nucleate or, stated another way, at a given rotating field, nucleation can occur at higher bias levels. It is to be understood that the formation of the groove in the insulating layer can also be used in the embodiment shown in FIGS. 1 and 2 and likewise a hairpin current carrying conductor can be used in both embodiments which insures operation at lower temperatures and higher bubble film anisotropic values ($H_k$).

FIG. 5 is still another embodiment where the V-shaped gap W is formed by point 44 of nucleate element 20 with the knife-like B reversed and the bubble propagation path 26 from the nucleate element 20 being located midway of the genertor 10 rather than at one end as in FIGS. 1 and 2. Except for the location of the bubble path 26, what has been said about the V-shaped gap W and the current carrying conductors 32 and 34 applies to this embodiment. Again, in these Figures those elements having the same function as those in FIGS. 1-4 are given the same identification.

It is to be noted also, in connection with the embodiment, that guard rail 46 of chevron elements is provided as a bubble isolating means to prevent unwanted bubbles generated on the knife-like element B when the in-plane rotating field is at a 180° vector from causing error in the information in the bubble domain device. Of course, guard rails or other bubble isolating features may be provided for the knife-like element B in FIGS. 1 and 3 for the very same purpose.

Turning now to FIG. 6, the operation of the generator of this invention will be described in connection with the embodiment of FIG. 1.

Positions a–e on the vector diagram, representing field phases, are also used to identify bubble positions in this Figure.

With the rotating field $H_r$ in vector direction a or 0°, the first bubble, bubble 1, would be generated at point 1a. At phase b, bubble 1 has striped, as at 1b, and is sliding down along the left side of element A. At phase c, bubble 1 has arrived at point 1c and continues on around the generator element 20 through phases d and e, where at 1e, bubble 1 is on pick-off bar 22 and at this time the second bubble, bubble 2, would be generated at position a. At phase f, bubble 1 is transferring off of kick-off bar 22 to the first of the elements 24 forming the bubble flow path. The second bubble, bubble 2, would be striped out and in phase position b at this time. This process will, of course, continue so long as desired. It is understood also that at approximately phase position a,e, a current pulse on conductor 32 will assist in nucleation at the gap W.

What is claimed is:

1. A bubble generator on a magnetic bubble domain structure which includes means capable of supporting magnetic bubble domains thereon in response to a selected magnetic bias and which has propagate elements under which bubbles propagate element-to-element in response to a rotating in-plane magnetic field,
   said propagate elements defining at least one bubble flow path,
   a pair of elongated elements disposed in axial alignment and being of a material on which bubbles propagate, one of said elements being located relative to said flow path to transfer bubbles thereto,
   said pair of elongated elements being separated by a gap for directing the rotating in-plane magnetic field from said one element into said means capable of supporting bubbles when said field is aligned with said pair of elements, thereby nucleating a bubble on said one element for transfer to said flow path.

2. The bubble generator as claimed in claim 1, wherein said means for supporting bubbles inclludes a material spacing said elements from said bubble film and wherein a portion of said material allows said gap defining means to be located closer to said bubble film than the remainder of said elements to enhance bubble generation.

3. The bubble generator as claimed in claim 1, wherein the elongated element of said pair opposite said one element is in the form of a taper.

4. The bubble generator as claimed in claim 3, wherein the gap is formed with an apex located near the axes of said elements.

5. The bubble generator as claimed in claim 3 wherein the gap is formed with an apex located in the axes of the elements.

6. The bubble genertor as claimed in claim 3, wherein said nucleate element is V-shaped on one end and forms part of a V-shaped gap.

7. The bubble generator as claimed in claim 3 further including bubble isolating means disposed relative to said element having a taper to isolate unwanted bubbles from said bubble flow path.

8. A bubble generator on a magnetic bubble domain structure comprising:
   means defining a layer of magnetic material capable of supporting magnetic bubbles thereon in response to a selected magnetic bias,
   propagate elements under which bubbles propagate element-to-element in response to a rotating in-plane magnetic field and defining at least one bubble flow path,
   a layer separating said propagate elements from said magnetic bubble supporting layer,
   a pair of elongated elements disposed end to end in axial alignment and of a material upon which bubbles will propagate in response to said rotating in-plane magnetic field, means between said elongated elements for directing magnetic flux lines generated by said in-plane magnetic field into said bubble supporting layer and parallel to said elongated elements when said rotating in-plane magnetic field is directed along the axial alignment of said elongated elements for nucleating a magnetic bubble under one of said elongated elements.

9. The bubble generator as claimed in claim 8, wherein said last mentioned means comprises means defining a gap.

10. The bubble generator as claimed in claim 9, wherein said gap is formed so as to have an apex to concentrate the magnetic poles formed by said in-plane magnetic field to enhance bubble nucleation.

* * * * *